(12) United States Patent
Vargo et al.

(10) Patent No.: US 9,312,983 B2
(45) Date of Patent: *Apr. 12, 2016

(54) SYSTEM AND METHOD FOR ENCODING TELEPHONE CALL DATA USING VARYING CODEC ALGORITHMS

(75) Inventors: Mike Vargo, San Mateo, CA (US); Jerry Chang, Los Altos, CA (US)

(73) Assignee: Advent IP LLC, Brooklyn, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/355,803

(22) Filed: Jan. 23, 2012

(65) Prior Publication Data

US 2012/0127988 A1    May 24, 2012

Related U.S. Application Data

(63) Continuation of application No. 13/114,050, filed on May 24, 2011, now Pat. No. 8,238,330, which is a continuation of application No. 10/906,598, filed on Feb. 25, 2005, now Pat. No. 8,032,808, which is a continuation of application No. 08/989,742, filed on Dec. 12, 1997, now abandoned, which is a continuation-in-part of application No. 08/907,686, filed on Aug. 8, 1997, now Pat. No. 6,167,060.

(51) Int. Cl.
| | |
|---|---|
| *H04L 12/28* | (2006.01) |
| *H04M 11/00* | (2006.01) |
| *H04L 1/00* | (2006.01) |
| *H03M 13/03* | (2006.01) |
| *H03M 13/35* | (2006.01) |
| *H04M 3/22* | (2006.01) |
| *H04M 3/12* | (2006.01) |
| *H04M 7/00* | (2006.01) |

(52) U.S. Cl.
CPC ............. *H04L 1/0014* (2013.01); *H03M 13/03* (2013.01); *H03M 13/35* (2013.01); *H04L 1/0009* (2013.01); *H04M 3/2218* (2013.01); *H04M 3/12* (2013.01); *H04M 7/006* (2013.01)

(58) Field of Classification Search
CPC ......... H04M 11/00; H03M 13/00; H04J 3/12; H04L 12/26; H04L 12/28
USPC ......... 370/401, 389, 352, 356, 410, 241, 412; 379/142, 201, 219, 220, 93.01, 93.15, 379/93.11, 93.09, 22.03, 93.14, 114; 375/240.1, 246, 253, 222
See application file for complete search history.

(56) References Cited

U.S. PATENT DOCUMENTS

| | | | | | |
|---|---|---|---|---|---|
| 5,940,479 | A  * | 8/1999 | Guy et al. | .................. | 379/93.01 |
| 6,041,345 | A  * | 3/2000 | Levi et al. | .................. | 709/217 |
| 6,167,060 | A  * | 12/2000 | Vargo et al. | .................. | 370/468 |
| 6,175,856 | B1 * | 1/2001 | Riddle | .................. | 709/204 |
| 7,336,649 | B1 * | 2/2008 | Huang | .................. | 370/352 |
| 8,032,808 | B2 * | 10/2011 | Vargo et al. | .................. | 714/746 |
| 8,238,330 | B2 * | 8/2012 | Vargo et al. | .................. | 370/352 |

* cited by examiner

*Primary Examiner* — Hanh N Nguyen

(57) ABSTRACT

A method and system for transmitting a call over a packet switched network. A gateway server receives a telephone call and converts analog voice signals associated with the telephone call to a stream of digital data. A first part of the digital data is processed using a first codec algorithm and transmitted over the packet switched network. A change in network conditions is detected. A second part of the digital data is processed using a second codec algorithm and transmitted over the packet switched network.

11 Claims, 8 Drawing Sheets

(a)

(b)

(c)

(d)

SYSTEM AND METHOD FOR ENCODING TELEPHONE CALL DATA USING VARYING CODEC ALGORITHMS

CROSS-REFERENCE TO RELATED APPLICATIONS

This application is a continuation of U.S. patent application Ser. No. 13/114,050, filed May 24, 2011 now U.S. Pat. No. 8,238,330, by Mike Vargo and Jerry Chang, entitled, "System and method for transmitting a telephone call over the Internet", which is a continuation of U.S. patent application Ser. No. 10/906,598, filed Feb. 25, 2005, by Mike Vargo and Jerry Chang, entitled, "System Architecture For Internet Telephone", which issued as U.S. Pat. No. 8,032,808, which is a continuation of U.S. patent application Ser. No. 08/989,742, filed Dec. 12, 1997 now abandoned, by Mike Vargo and Jerry Chang, entitled, "System Architecture For Internet Telephone," which is a Continuation-in-Part of U.S. patent application Ser. No. 08/907,686, filed Aug. 8, 1997, by Mike Vargo and Jerry Chang, entitled, "Dynamic Forward Error Correction Algorithm for Internet Telephone," which issued as U.S. Pat. No. 6,167,060. Each of aforesaid applications is hereby incorporated herein by reference in its entirety.

BACKGROUND OF THE INVENTION

1. Technical Field

The present invention relates generally to an Internet telephone system, and specifically to a system architecture for an Internet telephone operating between a Public Switched Telephone Network (PSTN) and the Internet.

2. Discussion of the Prior Art

Computer networks are often organized according to principles of client/server architecture. Servers are more powerful computers dedicated to managing the network, while clients are less powerful computers, e.g. PC's or workstations, that run applications. Clients rely upon servers for various resources. The most common client/server application is file sharing in distributed storage systems. Data is transferred between the hard disk of a workstation and the server memory. The advantage is that large quantities of data are stored on the server instead of at individual work stations, thereby reducing the workstation memory requirements. Moreover, non-private data is easily accessed by all work stations. In addition to distributed storage systems, print servers and network servers are prevalent forms of client/server architectures. Client/server architectures are also called two-tier architectures. Multi-node architectures that are not client/server architectures are called peer-to-peer architectures; in these, each node has equivalent responsibilities.

Another environment for a client/server architecture involves the Internet as an electronic marketplace. A person wishing to purchase an item on the Internet acts as a client by placing an order and the supplier acts as a server by filling that order. Transactions in the electronic marketplace require accounting and authentication by the server of purchases by the client. Encryption prevents eavesdropping and provides transaction security.

Internet telephony operates according to a number of possible strategies but all utilize digital signal processing (DSP). The most easily implemented Internet telephone systems involve software only, and work with existing modems and voice cards. Software provides DSP functions, which are computationally intensive tasks performed by the CPU of the host computer. However, such systems are not scalable beyond a few ports per system and are therefore applicable to small business gateways only. Moreover, the CPU is loaded down with DSP tasks.

DSP based cards with on-board software are more difficult and expensive to implement, but are scalable with designs including many cards per system, and thus applicable to medium and large size businesses and for inter-office calling over LAN, WAN and the Internet. These systems provide improved performance because they off-load functions such as audio compression/decompression and echo cancellation from the CPU of the host computer. The digital signal processing (DSP) functions are incorporated onto the card and latency (delay) is decreased.

A PBX integrated module is similar to a DSP card except that there is a seamless integration into the PBX phone system. This system is scalable to a higher port density than others, and is therefore applicable to larger business-to-business supersystems that bridge many PBX's and permit low cost international calling through Internet-PSTN gateways.

U.S. Pat. No. 5,633,916 to Goldhagen et al discloses a client/server architecture for a voice messaging service. Goldhagen et al sends client telephone messages over a PSTN via a server, but the architecture does not provide for sending packet-switched messages over the Internet.

U.S. Pat. No. 5,508,732 to Bottomley et al discloses a gateway architecture for broadcasting digital video over servers on demand. However, Bottomley et al is not concerned with sending voice information between clients in real time.

U.S. Pat. No. 5,657,376 to Espeut et al discloses an architecture for voice messaging systems that receives incoming calls over a public switched telephone network from subscribers utilizing personal computers. Espeut et al sends these messages over a server but is directed to local area networks and does not permit exchange of messages in real time.

The problem to be solved in Internet telephony systems is to combine the features of client/server architectures with digital signal processing to transmit voice information over the Internet. Furthermore, a practical Internet telephone system must have the capability of authenticating and billing callers in real time.

SUMMARY OF THE INVENTION

Internet telephone system that links a plurality of client stations to the Internet through a plurality of gateway servers. The system further includes a plurality of software modules performing digital signal processing (DSP) functions within each server. An account manager is placed at an arbitrary location on the Internet for monitoring transactions between client stations and for producing billing information in real time. Each server has hardware permitting Internet and ISDN connections and provides full duplex communication.

The gateway server includes hardware allowing respective Internet and PSTN connections, and software for providing the connections themselves. The software includes the transport, the telephone port, or "teleport," and the session. The transport creates a session upon receiving an incoming call from the Internet, and the session manages the network communication between communication endpoints and establishes identifiers or labels to indicate these endpoints. Also included in the software are the voice port, the wave port and the line port. The voice port selects the forward error correction algorithm, dynamically chooses the codec, and frames and aligns the data packets.

Another feature of the invention is that the architecture enables a dynamic change of codecs from packet-to-packet in one stream of voice data to adapt to changing network conditions. The architecture permits a dynamic change of codecs in combination with changing other factors including the level of redundancy of the error correction, the packet size and packet bundling. The architecture thereby seeks to attain the best speech quality and lowest latency given the level of data loss over the Internet detected by the system.

A further feature of the invention is a technique for eliminating dead air space in the data stream by speeding up or slowing down the data from the buffer while maintaining a constant voice pitch.

DETAILED DESCRIPTION OF THE PREFERRED EMBODIMENTS

The Internet telephone system of the present invention combines the essential features of client/server architectures and digital signal processing for voice communications. The DSP functions are integrated into a server instead of the individual work stations, with each server providing connection to the Internet for a plurality of client workstations. The central processing units of the client work stations are therefore freed from performing the computationally-intensive digital signal processing algorithms, which are instead executed at a gateway server, resulting in low latency. Callers in different countries communicate with one another over the Internet since there is at least one gateway server in each country. The gateway servers thus permit packet-switched voice communication between each of the client stations over the Internet.

Figure 1:
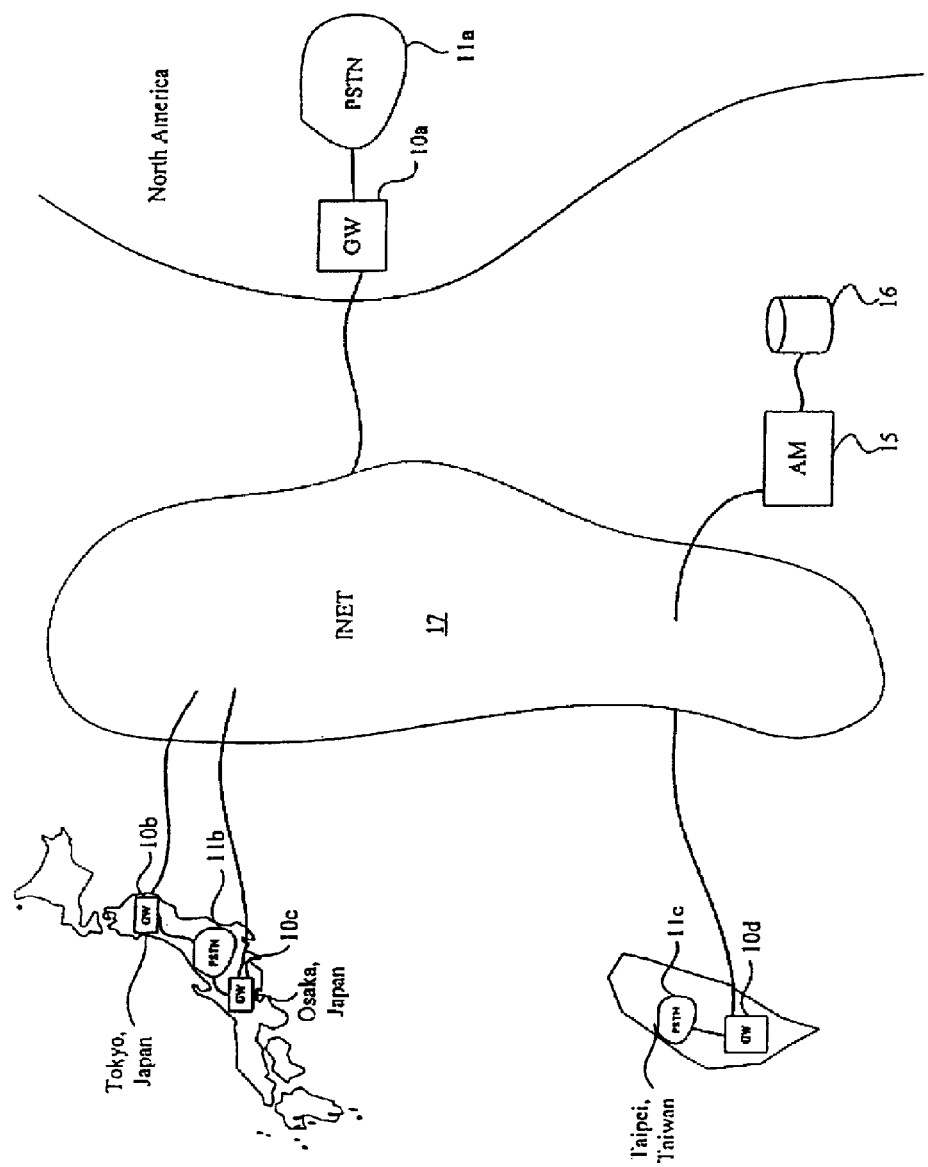
FIG. 1 shows an overview of an Internet telephone system according to the present invention.

FIG. 1 illustrates in general overview the operation of the Internet telephone system of the present invention. A call is initiated in North America over a PSTN gateway server 10a from a PSTN 11a. The server 10a supports either Telephone to Telephone conversations or PC to Telephone connections. FIG. 1 shows possible connections over the Internet 17 to Tokyo Japan, Osaka Japan and Taipei Taiwan. In each of these cities, a PSTN gateway server 10b-d is connected to a PSTN 11b-c and the Internet 17 to receive calls. An account manager (AM) 15 provides billing, monitoring and authentication of these telephone services for up to 25 servers. The account manager 15 interacts with a relational database 16, and is an intelligent network or service control point. The account manager 15 can be attached at any point on the network.

Figure 2:
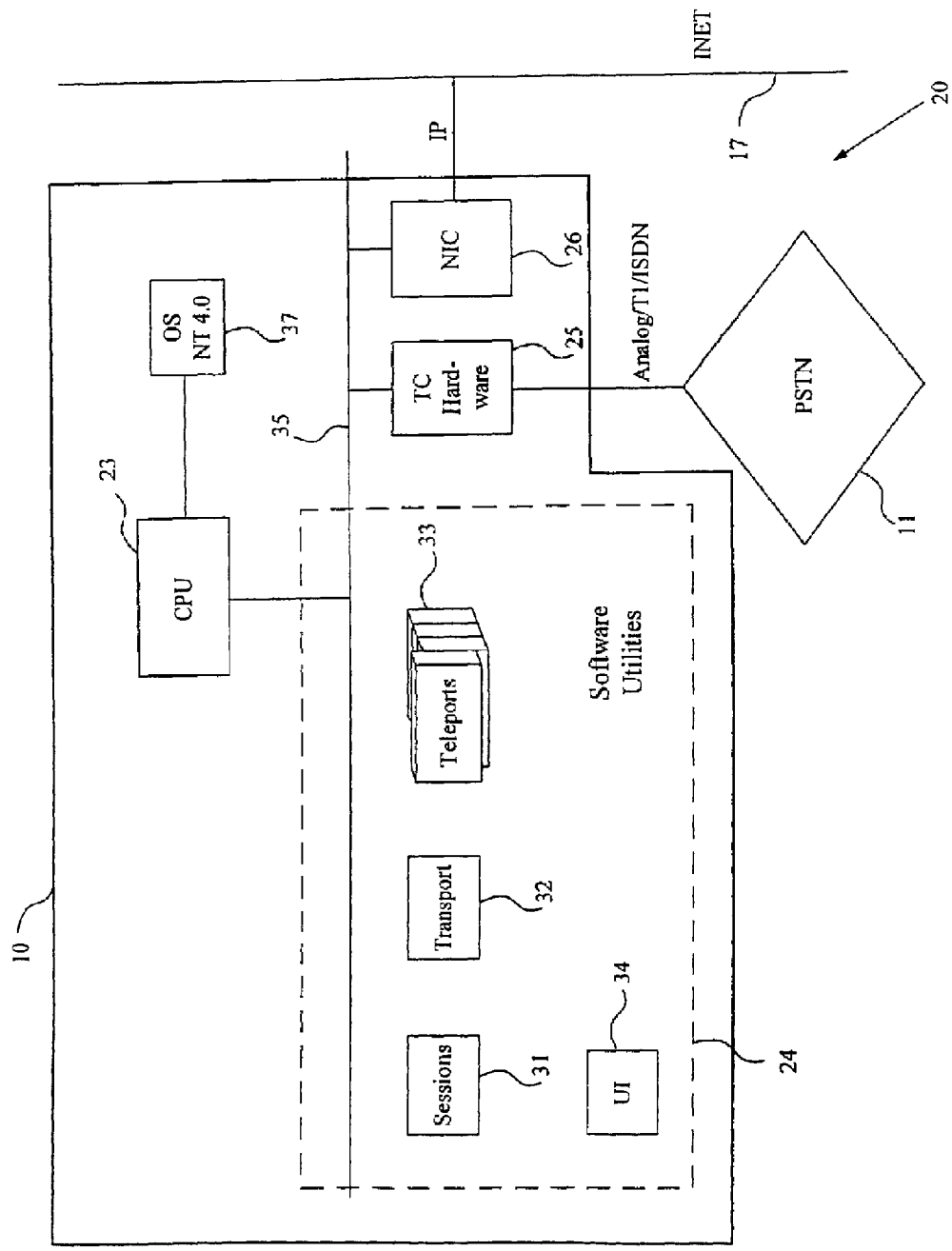
FIG. 2 details the main features of the gateway server of FIG. 1.

Referring to FIG. 2, each of the PSTN gateway servers 20 consists of a Public Switched Telephone Network 11 and a gateway server 10. Each gateway 10 consists of a central processing unit (CPU) 23, the Windows® Operating System (OS) 37, gateway software 24, telecommunications hardware (preferably Natural Microsystems) 25 and a Network Interface Card (NIC) 26 connected by a bus. The gateway operates on a "Wintel" platform, preferably with Windows® NT 4.0. The telecommunications hardware 25 supports analog, T1, EI or Integrated Services Digital Network (ISDN) connections to the PSTN 21, and the NIC 26 supports an Internet Protocol (IP) such as TCP (Transmission Control Protocol) or UDP (User Datagram Protocol) connection to the Internet 17.

FIG. 2 further shows the gateway server software utilities 24 which include modules called sessions 31, transport 32, a plurality of teleports 33 and a User Interface (UI) 34. A bus 35 connects software utilities 24 to CPU 23, the Windows® NT 4.0 Operating System 37, the telecommunications hardware 25 and the NIC 26.

Figure 3:
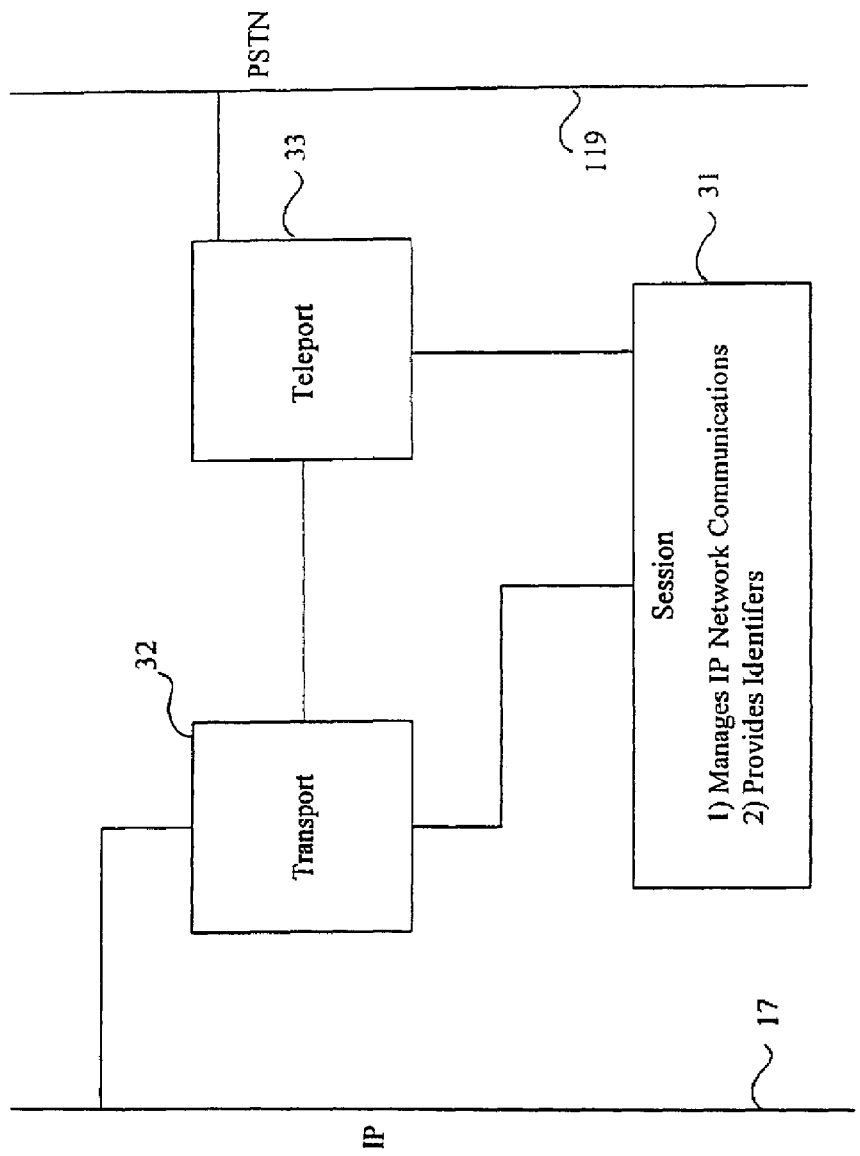
FIG. 3 shows the operation of the software modules in relationship to establishing a call connection.

FIG. 3 illustrates the operation of software utilities 24 in creating a call from an initiating client station. Transport 32 receives a call from the Internet 17, and creates a session 31 to join the call to the teleport 33. Assume there is a call incoming from the PSTN 11. This incoming call signals its arrival to the software 24 of the gateway server 10.

Associated with each audio port of the gateway server 10 is an object port, called a telephone port, or teleport 33, that waits for an incoming call. On the Internet side of the gateway 10, there is another object port called the transport 32. Between the teleports 33 and the transport 32 is an object called the sessions 31, which joins the ports on one gateway to ports on another gateway. The session 31 is the communication mechanism between teleports 33, and has two functions: (1) managing IP network communication between the incoming and outgoing ends of the server, and (2) providing labeling and identifiers to indicate the conversation endpoint. The sessions 31. Finds an available connection such that an incoming call from the telephone line 11 is joined to an outgoing message on the Internet 17. Similarly, if an incoming call arrives from the Internet 17, this call is received by the transport 32 at the ingress side of the server and the session 31 links this call on the egress side to a teleport 33 to produce an outgoing call on the PSTN 11.

The gateway server 10 has various software objects associated with the teleports 33 and the transport 32. For example, a teleport 33 has an echo suppressor for voice data and also an encapsulating algorithm. The transport 33 contains similar software for data filtering and correction.

Figure 4:
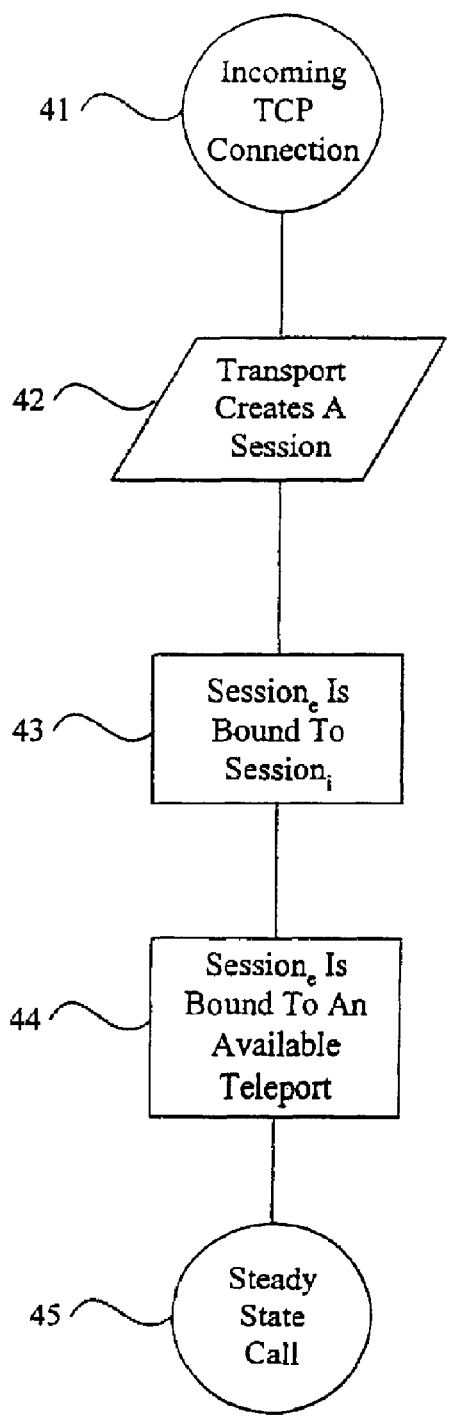
FIG. 4 is a flowchart of steps in connecting a call.

FIG. 4 shows a flowchart of the gateway software process for handling an outgoing (egress) call setup to illustrate the operation of the transport. Beginning in step 41, an incoming call is input to the transport 32, which listens for incoming TCP connections. In step 42, the transport creates an incoming session 31, session$_i$, and in step 43, this session 31 is bound to an outgoing or egress session 31, session$_e$, on the remote side of the gateway 10. Then, in step 44, session$_e$ is bound to an available telephone port 33 on the outbound side of the server 10. Step 45 indicates a steady state condition where the call has been set up with a pair of ports talking to one another.

The gateway server of the present invention supports both telephone to telephone conversations as well as PC to telephone conversations. Each server can accommodate up to 24 simultaneous conversations. High quality voice communication is established with low latency. The Gateway system includes 10 Base T or 100 Base T network connections, and has the ability to capture Dual Tone Multifrequency (DTMF) tones from end users.

Figure 5:
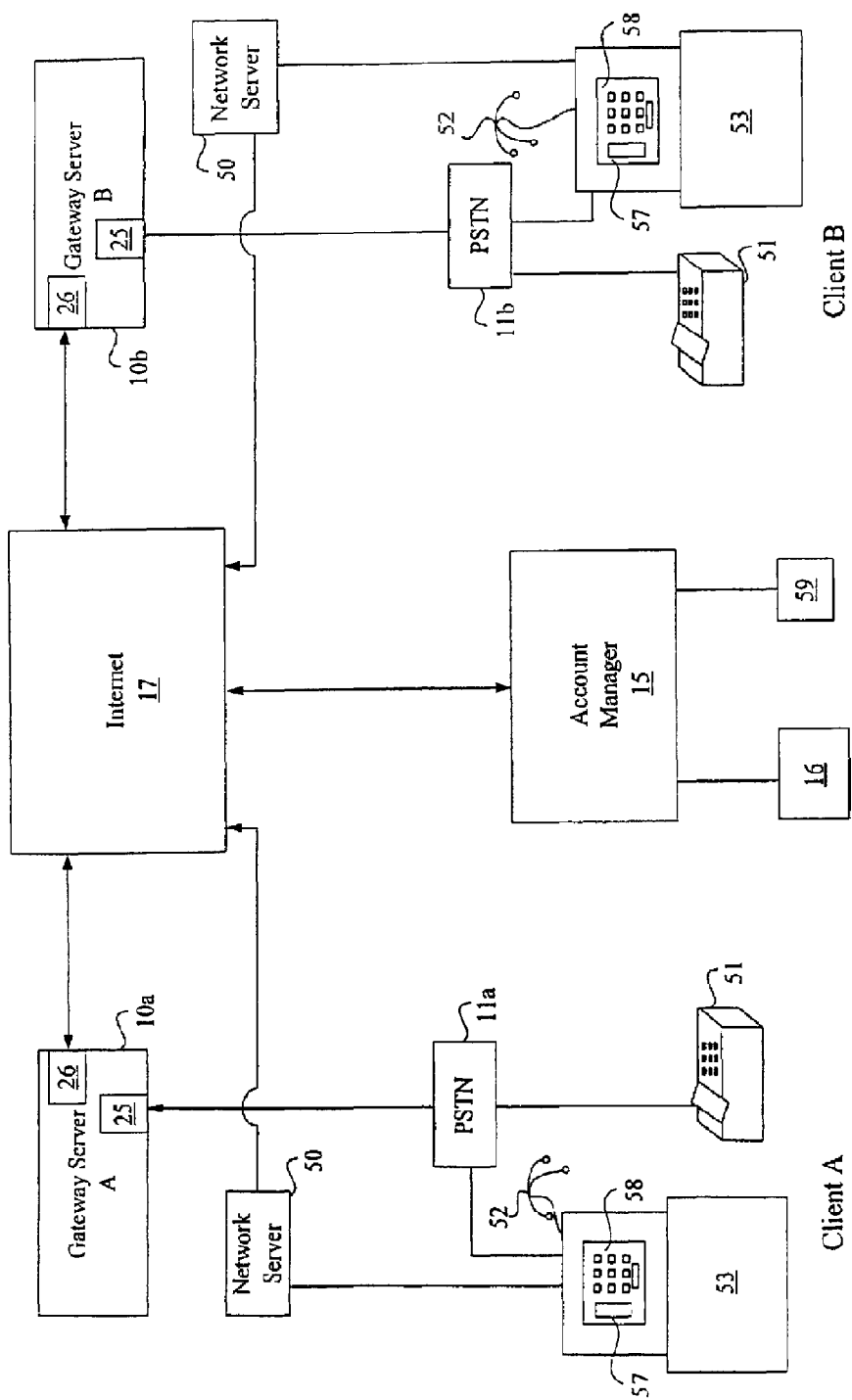
FIG. 5 shows the network architecture for establishing a call between clients over gateway servers.

FIG. 5 shows communication paths between client stations for the client/server architecture of the present invention. Client A initiates a call from either telephone hardware 51 or auxiliary hardware 52 connected to a personal computer 53. Telephone hardware 51 produces analog voice information signals which travel over PSTN 11a to first gateway server 10a. Alternatively, Client A initiates the call from personal computer 53, which has an audio headset 52 attached to a sound card in personal computer 53. Screen 57 of personal computer 53 contains icons 58 representing a keypad and other pushbuttons which are found on a conventional telephone. PC 53 converts analog voice signals from headset 52 to digital signals. These digital signals travel to gateway server 10a over PSTN 11a via a modem in computer 53 or over the Internet 17 via a network server 50.

These digital call signals from Client A enter gateway server 10a either from the Internet 17 via network interface card 26 or from the PSTN 11a via telecommunications hardware 25. Software modules 24 of gateway server 10a perform digital signal processing on the digital call signals from Client A. These DSP operations include compressing the voice data by supplying and executing a codec algorithm, canceling echoes with echo suppression algorithms, etc. Software modules 24 also establish a session 31 by assigning a teleport 33 to the call received from Client A and a transport 32 from gateway server 10a to the Internet 17, and encapsulate the data by providing identifiers.

Account manager 15 is located at any place on the Internet 17, and verifies that access codes and client identification from Client A are valid. Account manager 15 also maintains auditing information with respect to Client A's account, number of calls, time of calls, call logging information, etc. Assuming that account manager 15 has established that Client A's caller identification is accepted, gateway server 10a finds the address of the callee, Client B. Gateway server 10a also determines an appropriate gateway server 10b to access Client B. Gateway server 10a then transmits the call over the Internet 17, which sends the call as packet-switched message data over various nodes and routers to gateway server 10b.

Gateway server 10b receives the digital packet-switched call information from the Internet 17 via network interface card 26. Software modules 24 within gateway server 10b perform digital signal processing upon the digital call information. In particular, software modules 24 provide an appropriate voice decompression algorithm after examining the format and/or identifiers of the digital message. Software modules 24 also create a session by assigning a transport 32 to the message received from Internet 17, and linking a teleport 33 to transport 32 on the egress side of gateway server 10b. The message is then sent to Client B from teleport 33 of gateway server 10b via telecommunications hardware 25 over PSTN 11b. In full duplex operation, Client B establishes a corresponding session 31 to transmit messages back to Client A.

FIG. 5 also shows the operation of account manager 15 in producing real time billing information. Client A places a call request which is received at gateway server 10a. The call request contains information identifying Client A. In a preferred embodiment, gateway server 10a parses the client identification from the call header and sends it over the Internet 17 to account manager 15, which thereupon compares the client identification with account information stored in relational database 16 of account manager 15, and determines whether Client A is an active client. Account manager 15 then sends a call enable signal to gateway server 10a when Client A is an active client, and gateway server 10a permits the call to go through to gateway server 10b and Client B. Optionally, account manager 15 also activates a counter 59 to track the length of the call, and stores information about the two clients involved, their location, time and duration of the call in relational database 16 for billing purposes.

In an alternate embodiment, account manager 15 transmits at least some of this account authentication information for Client A to a storage site on gateway server 10a so that call enablement is performed at gateway server 10a. Advantageously, this embodiment permits faster call connection since gateway server 10a need not request call enablement from account manager 15, but this requires more storage facilities at a gateway server.

Teleport 33 supports up to 16 different varieties of codec algorithms for speech. A codec is a hardware or software mechanism for converting analog voice signals to digital signals and encoding the digital signals, and vice-versa. Teleport 33 is designed to be able to switch codecs between one data packet and the next in the same data stream. Each data packet is a self-describing package.

Figure 6:
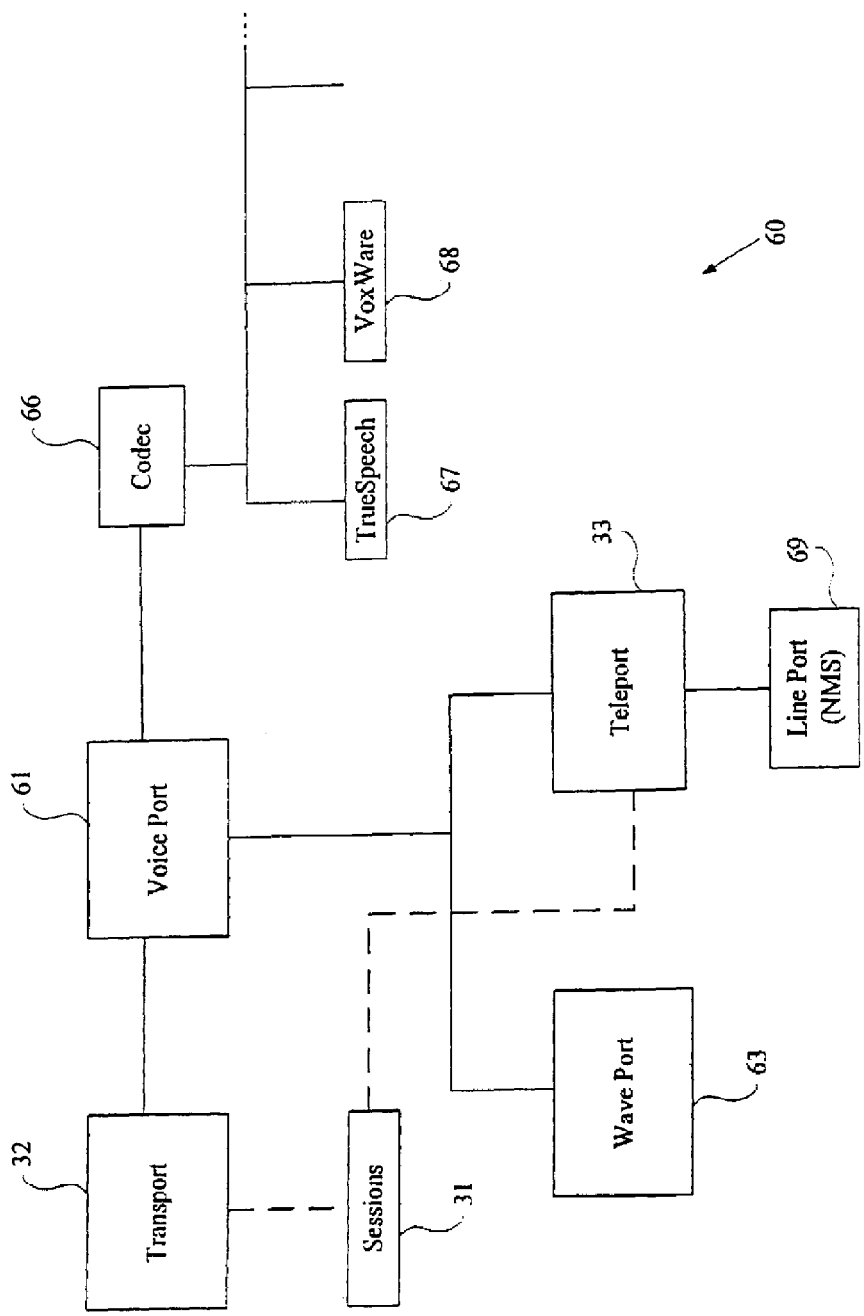
FIG. 6 shows the software modules of the gateway server in further detail.

FIG. 6 is a diagram of software modules 24 of FIG. 3 in further detail. Voice port 61 receives incoming data packets from the transport 32. Each transport 32 has many voice ports 61. Voice port 61 has derived classes of the wave port 63, which contains multimedia Application Program Interfaces (API's), and the teleport 33. Teleport 33 is connected to the PSTN through the line port 69 and to transport 32 by the sessions 31. Voice port 61 contains the codec algorithms 66. Among the different varieties of codec are the TrueSpeech algorithm 67, Vox Ware 68, the null speech algorithm and others.

Voice port 61 is responsible for three functions. First, it provides forward error correction. Second, it provides an algorithm for sending and regenerating speech. And third, it provides for alignment and framing of data packets within the buffer.

Figure 7A:
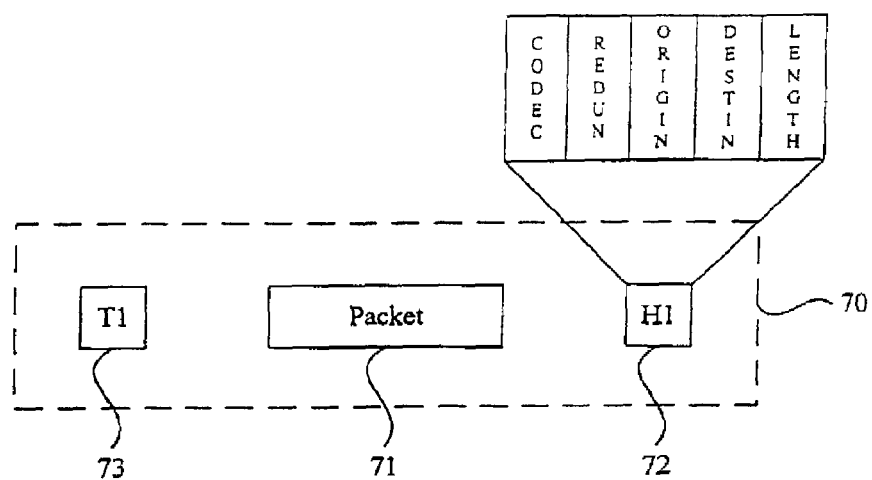
FIGS. 7(a) and (b) show the encapsulation of a data packet by the gateway.
Figure 7B:
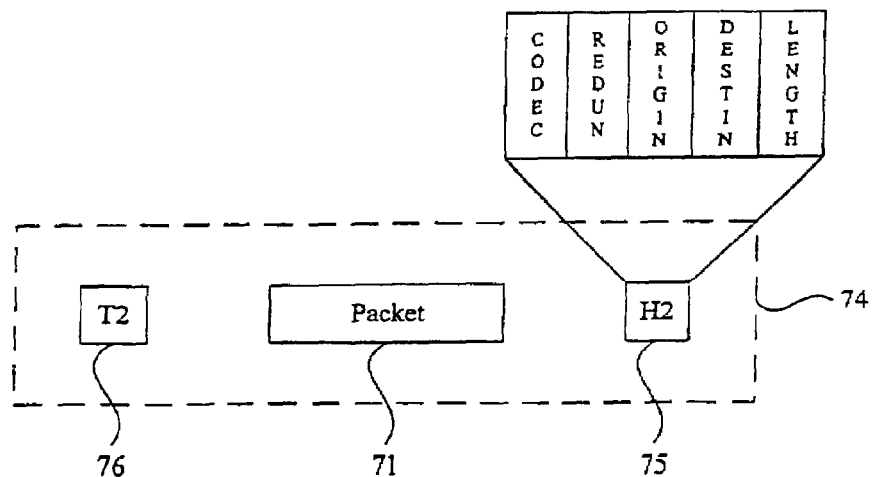

A data packet is contained within a frame, as shown in FIGS. 7(a) and 7(b). Frame A (70) consists of packet 71 plus header 72 and trailer 73 information fields, H1 and T1, where header H1 (72) and trailer fields T1 (73) are specific to the gateway server. The header H1 (72) and trailer T1 (73) fields of Frame A (70) include information about codec algorithm, level of redundancy, and length of packet 71, as well as the origination and destination addresses of Clients A and B, respectively. Another data packet 70 is framed in Frame B (74) with headers 75 and trailers 76, H2 and T2. Headers H2 (75) and trailers T2 (76) of Frame B (74) contain corresponding information about the codec algorithm, level of redundancy, length of packet 71, etc. Headers H2 (75) and trailers T2 (76) of Frame B (74) differ from headers H1 (72) and trailers T2 (73) of Frame A (70) because packet 71 is encoded with a different codec algorithm, level of redundancy, etc., in Frame A (70) than Frame B (74). The process by which the gateway server 10 places headers 72, 75 and trailers 73,76 onto data packet 71 is called encapsulation.

Generally, a given message is not sent as a continuous stream of information, but is broken up into blocks of data packets having variable lengths. The process by which a network link breaks up the data into packets is called segmentation, and the process by which the packets are put back together into a message at the receiving end is called reassembly. There are a variety of reasons for segmenting a message. First, a given network link only accepts messages up to some fixed length. Second, errors are more readily controlled, since it is not necessary to retransmit the entire message if there is an error in only part of the message. An error becomes more likely as the length of the message increases. Third, the network is shared more equitably, and one message does not monopolize the network, when the messages are segmented.

An important focus of the present invention is the particular forward error correction algorithm for providing packet redundancy. The basic problem is how to correct for certain packets of voice information being lost as they are transported across the Internet. Prior art approaches used interpolation to deal with lost packets. In the present invention, lost data packets can be recovered because these packets are duplicated downstream.

Packet redundancy effectively slows the information transmission rate because, due to replication, the information density is not as high. A packet with a redundancy of level one is twice as long as a packet with a redundancy of level zero, and a packet with a redundancy of level two is three times as long as a packet with a redundancy of level zero. Changing the packet redundancy in some ways has the same effect as the known technique of changing the packet size or packet bundling, since a different length is assigned to the data stream. But while changing the packet size or bundling puts more information in each packet, changing the packet redundancy does not. Still, even at the expense of transmission capacity, it is advantageous to provide redundancy in the data stream to eliminate voice nulls due to lost data, or dropouts, and thereby improve voice quality. Thus, a certain amount of transmission capacity is sacrificed for the overall success and integrity of the voice transmission.

The level of data redundancy for the error correction algorithm of the invention is between zero and three. That is, the data is replicated in zero to three subsequent packets of the message. The data stream of the message is sequenced, and it is important to keep the sequence intact. When the forward error correction algorithm is enabled, each data packet is compared to the previous data packet to determine whether there is a voice null or gap in the sequence. In the limiting case where the error correction algorithm is not enabled, the level of redundancy is zero. If the error correction algorithm is enabled and a voice null or gap is detected in the sequence, then the algorithm regenerates the lost packet through comparing the sequence numbers of the received packets for redundant data.

As a general principle, the three level fault tolerance is designed for marginal networks and can accommodate up to four consecutive dropped packets. The number of dropped packets varies according to a Poisson or similar type of statistical distribution (e.g. Pareto), with the majority of consecutive packet losses being in the range of one to four, with few consecutive packet losses in the tails of the distribution, i.e. numbering more than four consecutive losses.

Figure 8:
FIGS. 8(a) to (d) illustrate the operation of the forward error correction algorithm of the present invention.
Figure 8:
Figure 8:
Figure 8:
Figure 8:
Figure 8:
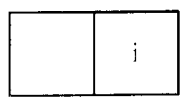
Figure 8:
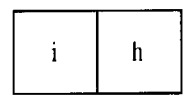
Figure 8:
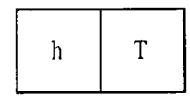
Figure 8:
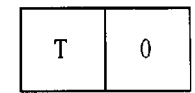
Figure 8:
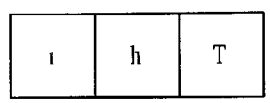
Figure 8:
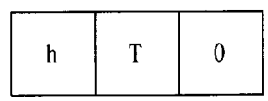
Figure 8:
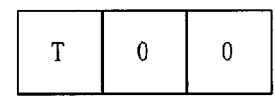
Figure 8:
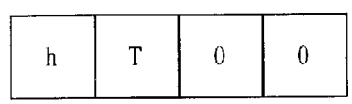
Figure 8:
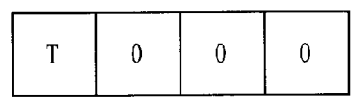

The particular error correction algorithm of the invention is described in FIGS. 8(a) to 8(d). In these examples, each box is assumed to be essentially one data packet, but for purposes of illustration each of these packets is illustrated as a letter of the alphabet. The grouping of data packets in pairs, triplets or quadruplets in FIGS. 8(a) to 8(d) is for purposes of illustration only; the data stream is continuous without spaces between the groupings. In FIG. 8(a), the data stream is illustrated as "This is a sentence." The data stream is propagating from left to right in the drawing, so that the "T" comes first, then the "h," then the "i," et cetera.

FIG. 8(b) shows the encoding scheme for error correction with a redundancy of level one. Conceptually, the data stream is arranged as a series of pairs of data packets. The last data packet of each pair is repeated as the first data packet of the next pair. Symbolically, for each packet N, $N_{last} \rightarrow N_{fir}+1$. The first packet of the first pair is initialized with a null value to protect against loss of the first data packet. Level one redundancy translates this into duplicated data packet pairs of "ØT", "Th", "hi", "is", and so on.

FIG. 8(c) illustrates the error correction algorithm of the invention when the level of redundancy is two. Here, data packets are arranged in triplets. The algorithm is constructed such that the last packet of the first triplet becomes the middle packet of the next triplet, and the middle packet of the first triplet becomes the first packet of the next triplet. Symbolically, $N_{mid} \rightarrow N_{fir}+2$, and $N_{last} \rightarrow N_{mid}+2$. As before, the packets are initialized with nulls to permit redundancy for the beginning packets in the data stream. Since the packets are in triplets, there must be nulls for the first two packets of the first triplet. Therefore, the data stream "This is a sentence." is replicated as "ØØT", "ØTh", "Thi", "his," et cetera. Each new triplet loses the first packet of the previous triplet.

FIG. 8(d) illustrates the error correction scheme for redundancy of level three. Here, the data packets are arranged in quadruplets. The algorithm is constructed such that the second packet in the first quadruplet is mapped to the first packet in the second quadruplet; the third packet in the first quadruplet is mapped to the second packet in the second quadruplet; and the fourth packet in the first quadruplet is mapped to the third packet in the second quadruplet; the first packet in the first quadruplet is not repeated in the next quadruplet. Symbolically, $N_{sec} \rightarrow N_{fir}+3$; $N_{thr} \rightarrow N_{sec}+3$ and $N_{four} \rightarrow N_{thr}+3$. In order to prevent the loss of first three data packets, a series of nulls is added to the first three data packets. The first quadruplet is initiated with three nulls, and these nulls are transformed by the algorithm into two nulls in the second quadruplet and one null on the third quadruplet.

More generally, for a redundancy of level k, for k=0 to L, the algorithm provides that the $i^{th}$ data packet is repeated k times at positions (i+j*k)) for j=1 to k.

One important feature of the forward error correction algorithm of the invention is that the level of redundancy can be dynamically varied from packet-to-packet within a data stream. For example, one group of packets can have a level one redundancy, the next group of packets can have a level three redundancy, and the following group of packets can have a level zero redundancy. Selecting the level of redundancy is one of the features performed by the voice port. Level three redundancy can sustain three consecutive packets losses by the Internet without the listener noticing a loss.

Instead of changing the packet redundancy, the voice port can also dynamically vary the packet size or bundling. The packet size may initially be 67 bytes, with 64 bytes of information and a 3 byte header. The packet bundling may be changing by bundling two 64 byte packets together with a 3 byte header to give a 131 byte packet. Or, the packet size could be changed from 64 bytes to 32 bytes of information to give a 35 byte packet, including a 3 byte header. Both the packet size and packet bundling can be changed by the voice port from packet-to-packet in the data stream to accommodate the loss characteristics of the Internet at that particular time.

Furthermore, not only does the voice port have the capability of dynamically changing the redundancy, packet size and packet bundling from packet to packet, but also the voice port can similarly vary the codec algorithm from packet-to-packet. The packet is given self-describing information about what type of codec is needed at the receiver to decompress the packet. The choice of codec at the transmitter may be derived from a complex function depending on the choices of packet redundancy, packet size and packet bundling.

The voice port can thus dynamically pick the speech compression algorithm, the data packet size, and the type of forward error correction to adapt to network conditions. A complex feedback algorithm describes the various conditions under which the voice port adjusts these variables. The voice port can also select from several qualities of codec in response to possible conditions presented by the network.

Generally speaking, the voice port increases the packet redundancy when it detects a loss of information, and this implies that less information will be propagating in a given packet stream. To accommodate the same quantity of information through the limited bandwidth of a modem, speech quality must be sacrificed. Therefore, a faster but lower speech quality codec algorithm is simultaneously implemented. The result is that the loss of data packets is compensated by the redundancy.

As an example, assume the voice port begins with the TrueSpeech codec algorithm, which encodes speech at an 8.5 kbytes/second and with no redundancy. After noticing dropped packets, the voice port adjusts by selecting the Vox Ware 2.9 kbytes/second algorithm having somewhat lower sound quality, but with two level redundancy error correction. Double redundancy VoxWare includes two 2.9 kbytes/second algorithms, which is still approximately 6 kbytes/second. Thus, it is possible to change the redundancy and the codec to correct for dropped packets and utilize the same amount of Internet bandwidth. Fault tolerance in the voice transmission data is thereby achieved.

It is also possible to vary the size of the individual packets or to vary the bundling of the packets by techniques that are well known in the art. The voice port is tolerant of faults in the data stream, while the standard procedure for Transmission Control Protocol (TCP) on the Internet is to request a retransmission of the data.

An alternate embodiment of the invention adjusts for dead time in a speech message by time warping the speech at a constant pitch. Generally, once the integrity of the data stream is guaranteed by the error correction algorithm, at least part of the data stream waits in a buffer on the receiving side of the server until it is emptied to the receiver. However, when there is no data left in the buffer, there is a danger that dead air time can occur, in which the listener hears a gap or blank in the transmission. Therefore, the software further contains a utility that senses when the data buffer becomes depleted, and stretches the data reaching the ear of the listener in a manner opposite to the technique utilized in television commercials and radio voiceovers to speed up the data rate. Effectively, the algorithm contains a lever that measures the number of packets in the buffer, and, without changing the pitch, speeds up or slows down the data rate corresponding to the pool depth. The Vox Ware codec particularly supports this algorithm to specify the degree of time warp.

Another important characteristic of voice port 61 is that it permits codec encapsulation so that the higher level software is functionally independent of the lower level codec software. The codecs are therefore essentially objects and neither the transport nor any of the other software needs to be compatible with any particular codec. As new codecs are introduced, they can be added easily added without requiring modifications in the higher level system software.

The invention has been described in general terms according to the preferred embodiments. However, those of ordinary skill in the art will understand that certain modifications or changes may be made to the disclosed embodiment without departing from the essential nature of the invention. Therefore, the scope of the invention is to be limited only by the following claims.

What is claimed is:

1. A method for transmitting a call, the method comprising:
   in a gateway server:
      receiving a stream of digital data associated with a telephone call, the digital signals converted from analog voice signals associated with the telephone call
      processing a first part of the digital data using a first codec algorithm;
      transmitting the processed first part of the digital data over a packet switched network;
      detecting a change in network conditions;
      processing a second part of the digital data using a second codec algorithm; and
      transmitting the processed second part of the digital data over the packet switched network,
      wherein the processed first part of the digital data and the processed second part of the digital data comprise a plurality of packets, wherein each packet includes self-describing information that indicates the type of codec used for processing the packet.

2. The method of claim 1, wherein the packet switched network is the Internet.

3. The method of claim 1, further comprising:
   applying a forward error correction algorithm with a first level of redundancy to the first part of the digital data; and
   applying a forward error correction algorithm with a second level of redundancy to the second part of the digital data.

4. A gateway server coupled to a packet switched network and configured to:
   receive a stream of digital data associated with a telephone call,
   the digital signals converted from analog voice signals associated with the telephone call;
   process a first part of the digital data using a first codec algorithm;
   transmit the processed first part of the digital data over the packet switched network;
   detect a change in network conditions;
   process a second part of the digital data using a second codec algorithm; and
   transmit the processed second part of the digital data over the packet switched network,
   wherein the processed first part of the digital data and the processed second part of the digital data comprise a plurality of packets, wherein each packet includes self-describing information that indicates the type of codec used for processing the packet.

5. The gateway server of claim 4, wherein the packet switched network is the Internet.

6. The gateway server of claim 4, further configured to:
   apply a forward error correction algorithm with a first level of redundancy to the first part of the digital data; and
   apply a forward error correction algorithm with a second level of redundancy to the second part of the digital data.

7. A gateway server coupled to a packet switched network and configured to:
   receive a stream of digital data associated with a telephone call, the digital signals converted from analog voice signals associated with the telephone call;
   process a first part of the digital data using a first set of processes;
   transmit the processed first part of the digital data over the packet switched network to a remote server;
   detect a change in network conditions;
   process a second part of the digital data using a second set of processes; and
   transmit the processed second part of the digital data over the packet switched network to the remote server,
   wherein the processed first part of the digital data and the processed second part of the digital data comprise a plurality of packets, wherein each packet includes self-describing information that indicates the set of processes used for processing the racket.

8. The gateway server of claim 7, wherein the first set of processes comprises a first codec algorithm and wherein the second set of processes comprises a second codec algorithm.

9. The gateway server of claim 7, wherein the first set of processes comprises a first level of redundancy used in a forward error correction algorithm and wherein the second set of processes comprises a second level of redundancy used in a forward error correction algorithm.

10. The gateway server of claim 7, wherein the first set of processes comprises a first process for packetizing digital data using a first packet size and wherein the second set of processes comprises a second process for packetizing digital data using a second packet size.

11. The gateway server of claim 7, wherein the packet switched network is the Internet.

* * * * *